United States Patent
Fang et al.

(10) Patent No.: US 7,514,714 B2
(45) Date of Patent: Apr. 7, 2009

(54) THIN FILM POWER MOS TRANSISTOR, APPARATUS, AND METHOD

(75) Inventors: Ming Fang, Plano, TX (US); Fuchao Wang, Plano, TX (US)

(73) Assignee: STMicroelectronics, Inc., Carrollton, TX (US)

( * ) Notice: Subject to any disclaimer, the term of this patent is extended or adjusted under 35 U.S.C. 154(b) by 11 days.

(21) Appl. No.: 11/355,937

(22) Filed: Feb. 16, 2006

(65) Prior Publication Data

US 2007/0200172 A1 Aug. 30, 2007

(51) Int. Cl.
- H01L 27/108 (2006.01)
- H01L 29/04 (2006.01)
- H01L 29/12 (2006.01)
- H01L 29/76 (2006.01)
- H01L 31/036 (2006.01)
- H01L 31/112 (2006.01)

(52) U.S. Cl. ............... 257/66; 257/57; 257/382; 257/383; 257/384; 257/385; 257/E29.117; 257/E29.151; 257/E29.202; 257/E29.273

(58) Field of Classification Search ......... 257/382–385, 257/57, 66, E29.117, E29.151, E29.202, 257/E29.273
See application file for complete search history.

(56) References Cited

U.S. PATENT DOCUMENTS

| | | | | |
|---|---|---|---|---|
| 5,332,686 A | * | 7/1994 | Glenn | 438/107 |
| 5,499,124 A | * | 3/1996 | Vu et al. | 349/45 |
| 5,536,950 A | * | 7/1996 | Liu et al. | 257/59 |
| 5,698,869 A | * | 12/1997 | Yoshimi et al. | 257/192 |
| 5,945,709 A | * | 8/1999 | Williams et al. | 257/343 |
| 6,046,474 A | * | 4/2000 | Oh et al. | 257/343 |
| 6,104,060 A | * | 8/2000 | Hshieh et al. | 257/329 |
| 6,841,434 B2 | * | 1/2005 | Miyairi et al. | 438/166 |
| 6,855,988 B2 | * | 2/2005 | Madurawe | 257/347 |
| 6,888,200 B2 | * | 5/2005 | Bhattacharyya | 257/348 |
| 6,917,078 B2 | * | 7/2005 | Bhattacharyya | 257/347 |
| 7,339,830 B2 | * | 3/2008 | Bhattacharyya | 365/185.18 |
| 2002/0001888 A1 | * | 1/2002 | Yoneda | 438/166 |
| 2002/0177260 A1 | * | 11/2002 | Matsumoto | 438/154 |
| 2003/0201497 A1 | * | 10/2003 | Inoue et al. | 257/351 |
| 2004/0099890 A1 | * | 5/2004 | Umimoto et al. | 257/288 |
| 2004/0142579 A1 | * | 7/2004 | Morita et al. | 438/785 |
| 2004/0180481 A1 | * | 9/2004 | Voutsas et al. | 438/166 |
| 2004/0217424 A1 | * | 11/2004 | Shih | 257/355 |
| 2004/0227197 A1 | * | 11/2004 | Maekawa | 257/410 |
| 2005/0023613 A1 | * | 2/2005 | Bhattacharyya | 257/348 |
| 2005/0079659 A1 | * | 4/2005 | Duan et al. | 438/197 |
| 2005/0087764 A1 | * | 4/2005 | Inoue et al. | 257/192 |
| 2005/0224796 A1 | * | 10/2005 | Zhang et al. | 257/59 |

(Continued)

*Primary Examiner*—Ida M Soward
(74) *Attorney, Agent, or Firm*—Lisa K. Jorgenson; William A. Munck

(57) ABSTRACT

A thin film power transistor includes a plurality of first doped regions over a substrate and a second doped region forming a body. At least a portion of the body is disposed between the plurality of first doped regions. The thin film power transistor also includes a gate over the substrate. The thin film power transistor further includes a dielectric layer, at least a portion of which is disposed between (i) the gate and (ii) the first and second doped regions. In addition, the thin film power transistor includes a plurality of contacts contacting the plurality of first doped regions, where the plurality of first doped regions forms a source and a drain of the thin film power transistor. The first doped regions could represent n-type regions (such as N– regions), and the second doped region could represent a p-type region (such as a P– region). The first doped regions could also represent p-type regions, and the second doped region could represent an n-type region.

20 Claims, 2 Drawing Sheets

U.S. PATENT DOCUMENTS

| | | | |
|---|---|---|---|
| 2006/0049444 A1* | 3/2006 | Shino ......................... 257/296 |
| 2006/0049467 A1* | 3/2006 | Lim et al. ................... 257/383 |
| 2006/0108579 A1* | 5/2006 | Kim et al. ..................... 257/40 |
| 2006/0138427 A1* | 6/2006 | Yamazaki et al. ............. 257/72 |
| 2006/0145245 A1* | 7/2006 | Hara et al. ................... 257/327 |
| 2006/0220151 A1* | 10/2006 | Loechelt et al. ............. 257/387 |
| 2006/0258069 A1* | 11/2006 | Yamazaki et al. ........... 438/166 |
| 2007/0002195 A1* | 1/2007 | Cho ............................ 349/43 |

* cited by examiner

THIN FILM POWER MOS TRANSISTOR, APPARATUS, AND METHOD

TECHNICAL FIELD

This disclosure is generally directed to integrated circuits and more specifically to a thin film power Metal Oxide Semiconductor (MOS) transistor, apparatus, and method.

BACKGROUND

A thin film transistor represents a transistor that is fabricated by depositing thin films of material on a substrate. The thin films of material typically form an active semiconductor element, a dielectric or other passivation layer, and metallic contacts. Thin film transistors are often manufactured on solid or flexible substrates. Thin film transistors have been used extensively in various applications, such as flat panel liquid crystal display (LCD) devices and portable electronic devices.

Conventional thin film transistors often operate at lower voltages, typically between zero and five volts. However, lower voltages often result in lower performance and a worse integration scale. Ideally, higher voltage elements may be used with the thin film transistors to help increase performance and provide a better integration scale. Unfortunately, higher voltages often result in damage to or destruction of the conventional thin film transistors.

SUMMARY

This disclosure provides a thin film power MOS transistor, apparatus, and method.

In a first embodiment, a transistor includes a plurality of first doped regions over a substrate and a second doped region forming a body. At least a portion of the body is disposed between the plurality of first doped regions. The transistor also includes a gate over the substrate. The transistor further includes a dielectric layer, at least a portion of which is disposed between (i) the gate and (ii) the first and second doped regions. In addition, the transistor includes a plurality of contacts contacting the plurality of first doped regions, where the plurality of first doped regions forms a source and a drain of the transistor.

In particular embodiments, the first doped regions represent n-type regions (such as N− regions), and the second doped region represents a p-type region (such as a P− region). In other particular embodiments, the first doped regions represent p-type regions, and the second doped region represents an n-type region.

In a second embodiment, an apparatus includes a display panel that is capable of displaying graphical images and that includes a matrix of thin film transistors. The apparatus also includes a driver circuit capable of controlling the thin film transistors to control the graphical images displayed on the display panel. Each of at least one of the thin film transistors includes a plurality of first doped regions over a substrate and a second doped region forming a body. At least a portion of the body is disposed between the plurality of first doped regions. Each of at least one of the thin film transistors also includes a gate over the substrate. Each of at least one of the thin film transistors further includes a dielectric layer, at least a portion of which is disposed between (i) the gate and (ii) the first and second doped regions. In addition, each of at least one of the thin film transistors includes a plurality of contacts contacting the plurality of first doped regions, where the plurality of first doped regions form a source and a drain of the thin film transistor.

In a third embodiment, a method includes forming over a substrate a plurality of first doped regions and a second doped region forming a body. At least a portion of the body is disposed between the plurality of first doped regions. The method also includes forming a gate over the substrate and forming a dielectric layer. At least a portion of the dielectric layer is disposed between (i) the gate and (ii) the first and second doped regions. In addition, the method includes forming a plurality of contacts contacting the plurality of first doped regions. The plurality of first doped regions forms a source and a drain of a transistor.

Other technical features may be readily apparent to one skilled in the art from the following figures, descriptions, and claims.

BRIEF DESCRIPTION OF THE DRAWINGS

For a more complete understanding of this disclosure and its features, reference is now made to the following description, taken in conjunction with the accompanying drawings, in which.

DETAILED DESCRIPTION

Figure 1:
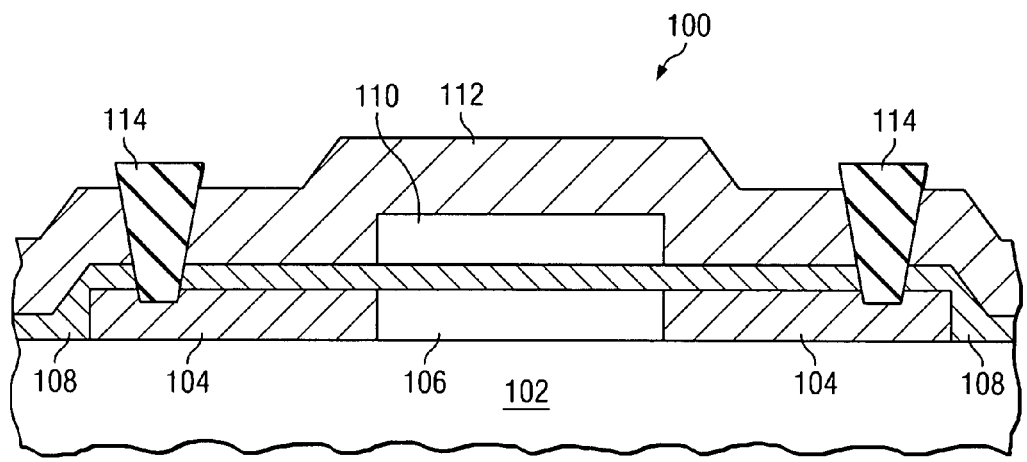
FIG. 1 illustrates a conventional thin film power MOS transistor.

FIG. 1 illustrates a conventional thin film power MOS transistor 100. In this example, the transistor 100 includes a substrate 102. The substrate 102 typically represents a substrate such as glass, metal, or polysilicon. If any conductive materials are used as the substrate 102, a dielectric layer is typically deposited over the substrate 102 to serve as an insulator. The transistor 100 also includes two N+ regions 104, which represent regions having one or more n-type dopants. The N+ regions 104 form the source and drain of the transistor 100. The N+ regions 104 are separated from one another by an undoped region 106, such as undoped polysilicon. A dielectric layer 108 is formed over the substrate 102, N+ regions 104, and undoped region 106. The dielectric layer 108 could represent, for example, a layer of silicon oxide or other dielectric material or materials. A gate 110 is formed over the dielectric layer 108. The gate 110 may be formed from any suitable material or materials, such as one or more metals. A passivation layer 112 is formed over the gate 110 and the dielectric layer 108. The passivation layer 110 could be formed, for example, from an oxide or other material or materials. Two contacts 114 are formed through the passivation layer 112 and the dielectric layer 108 and contact the N+ regions 104. The contacts 114 could be formed, for example, from one or more metals or other conductive materials.

The transistor 100 shown in FIG. 1 typically suffers from various shortcomings. For example, the transistor 100 can often be used in low voltage applications, such as applications where a voltage applied to the transistor 100 does not exceed five volts. The transistor 100 typically cannot be used in applications requiring higher voltage levels without damaging or destroying the transistor 100.

FIGS. 2 through 5 illustrate example thin film power MOS transistors according to different embodiments of this disclosure. The thin film transistors shown in FIGS. 2 through 5 may be capable of operating in higher voltage applications. These higher voltage applications could include medium-voltage applications, such as applications involving voltages of twenty to forty volts, or high-voltage applications, such as applications involving voltages greater than forty volts.

Figure 2:
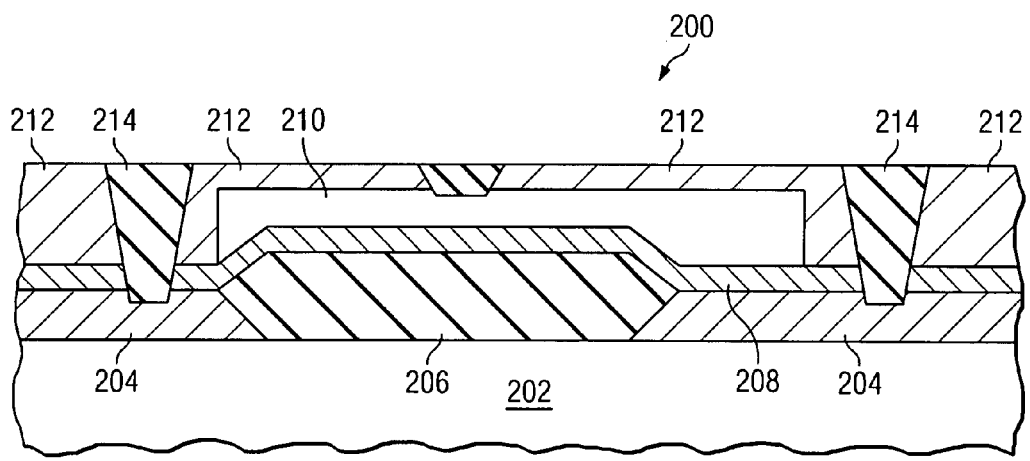
FIGS. 2 through 5 illustrate example thin film power MOS transistors according to different embodiments of this disclosure.

FIG. 2 illustrates a thin film power MOS transistor 200. In this example, the transistor 200 includes a substrate 202. The substrate 202 could represent glass, polysilicon, or other rigid substrate. The substrate 202 could also represent a flexible substrate, such as cloth, plastic, or metal foil.

The transistor 200 also includes two N− regions 204, which form the source and drain of the transistor 200. The N−regions 204 represent regions having one or more n-type dopants. The N− regions 204 are separated from one another in this example by a P− region 206 serving as a p-body. The P− region 206 represents a region having one or more p-type dopants. The N−regions 204 and the P− region 206 may each represent, for example, a region of polysilicon doped or implanted with suitable dopant(s). In some embodiments, separate N− regions 204 are fabricated. In other embodiments, a single N− region could be fabricated, and a p-body formed by the P− region 206 may be embedded into the single N−region to form the two N− regions 204 shown in FIG. 2. In addition, the dopings of the regions 204-206 could be reversed, where the regions 204 are doped with P− dopant(s) and the region 206 is doped with N− dopant(s) forming an n-body.

A dielectric layer 208 is formed over the N− regions 204 and the p-body represented by the P− region 206. A gate 210 is formed over the dielectric layer 208, and a passivation layer 212 is formed over the dielectric layer 208 and the gate 210. Two contacts 214 are formed through the passivation layer 212 and the dielectric layer 208 to contact the N− regions 204, and a third contact is formed through the passivation layer 212 to contact the gate 210. The dielectric layer 208 may be formed from any suitable dielectric materials(s), and the passivation layer 212 may be formed from oxide or any other suitable materials(s). Each of the contacts 214 and the gate 210 may be formed from any suitable conductive material(s).

The following represents one specific example of how the transistor 200 can be fabricated. The fabrication technique described below is for illustration only. The transistor 200 could be fabricated using any other suitable technique. Also, for ease of explanation, clean-up operations that occur between fabrication steps are omitted in the following discussion.

An N− doped polysilicon is deposited on the substrate 202. The N− doped polysilicon could be deposited, for example, using in-situ plasma enhanced chemical vapor deposition (PECVD). The N− doped polysilicon is then patterned and etched to form the two N− regions 204. A P− doped polysilicon for forming the p-body is deposited on the N− regions 204 and the substrate 202, such as by using in-situ PECVD. The P− doped polysilicon is then patterned and etched to form the P− region 206. The dielectric layer 208 is deposited on the N− regions 204 and the P− region 206, such as by using PECVD. One or more conductive materials, such as metal, are deposited on the dielectric layer 208 and then patterned and etched to form the gate 210. The passivation layer 212 is deposited over the dielectric layer 208 and the gate 210 using any suitable technique. The passivation layer 212 is patterned and etched, and one or more conductive materials are deposited on the passivation layer 212 and then etched to form the contacts 214.

In particular embodiments, the transistor 200 shown in FIG. 2 is fabricated using a low temperature process and is suitable for use in medium voltage applications. The low temperature process could represent, for example, a process where the transistor 200 is fabricated at temperatures not exceeding 150° C. or 200° C. The medium voltage application could represent, for example, an application where the transistor 200 is exposed to a maximum voltage of approximately forty volts. As a more specific example, the low temperature process could allow the transistor 200 to be fabricated on cloth or other soft substrate. This may allow, for example, clothing to be produced with transistors that can measure body temperature or store data. The transistor 200 could be fabricated using any other process and/or used in any other application.

Figure 3:
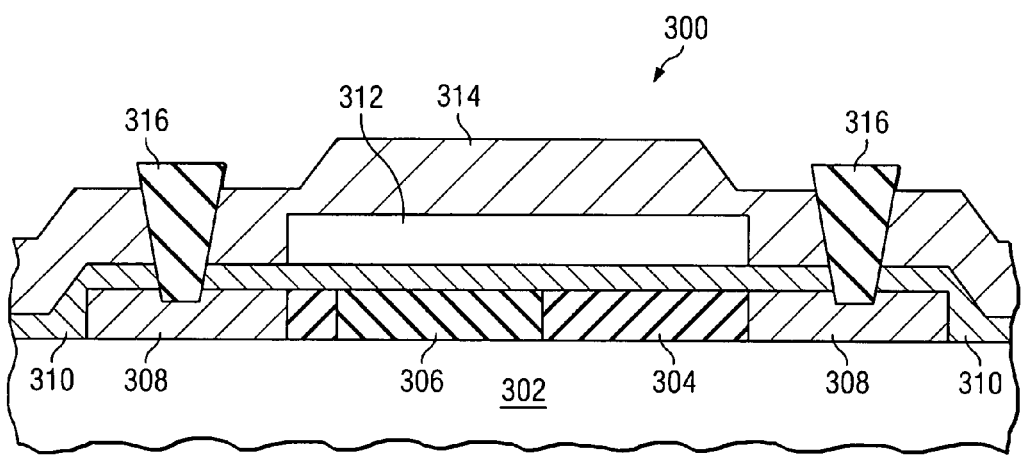

FIG. 3 illustrates a thin film power MOS transistor 300. The transistor 300 includes a substrate 302, which could represent a rigid or flexible substrate. The transistor 300 also includes two N− regions 304, a P− region 306 serving as a p-body, and two N+ regions 308. The N+ regions 308 represent the source and drain of the transistor 300. The N− regions 304, P− region 306, and N+ regions 308 may each represent, for example, a region of polysilicon doped or implanted with appropriate dopant(s). In some embodiments, separate N− regions 304 are fabricated. In other embodiments, a single N− region could be fabricated, and a p-body formed by the P− region 306 may be embedded into the single N−region to form the two N− regions 304 shown in FIG. 3. Similarly, in some embodiments, separate N+ regions 308 are fabricated. In other embodiments, a single N+ region could be fabricated, and the N− regions 304 (either as one or multiple regions) and the P− region 306 may be formed in the single N+region to form the two N+ regions 308 shown in FIG. 3. In addition, the dopings of the regions 304-308 could be reversed, where the regions 304 are doped with P− dopant(s), the region 306 is doped with N− dopant(s) forming an n-body, and the regions 308 are doped with P+ dopant(s).

A dielectric layer 310 is formed over the substrate 302, N− regions 304, P− region 306, and N+ regions 308. A gate 312 is formed over the dielectric layer 310 and above the N− regions 304 and the p-body represented by the P− region 306. A passivation layer 314 is formed over the dielectric layer 310 and the gate 312. Contacts 316 are formed through the passivation layer 314 and the dielectric layer 310 to contact the N+ regions 308.

The following represents one specific example of how the transistor 300 can be fabricated. Other techniques could also be used to fabricate the transistor 300. An N− doped polysilicon is deposited on the substrate 302, such as by using in-situ PECVD. The N− doped polysilicon is then patterned, and a P− type implant is performed. This forms the P− region 306, which serves as a p-body separating the two N− regions 304. The dielectric layer 310 is deposited on the doped regions 304-306, such as by using PECVD. Rapid thermal annealing is then performed to form the N+ regions 308. One or more conductive materials are deposited on the dielectric layer 310 and patterned and etched to form the gate 312. The passivation layer 314 is deposited over the dielectric layer 310 and the gate 312 using any suitable technique. The passivation layer 314 is patterned and etched, and one or more conductive materials are deposited and etched to form the contacts 316.

Figure 4:
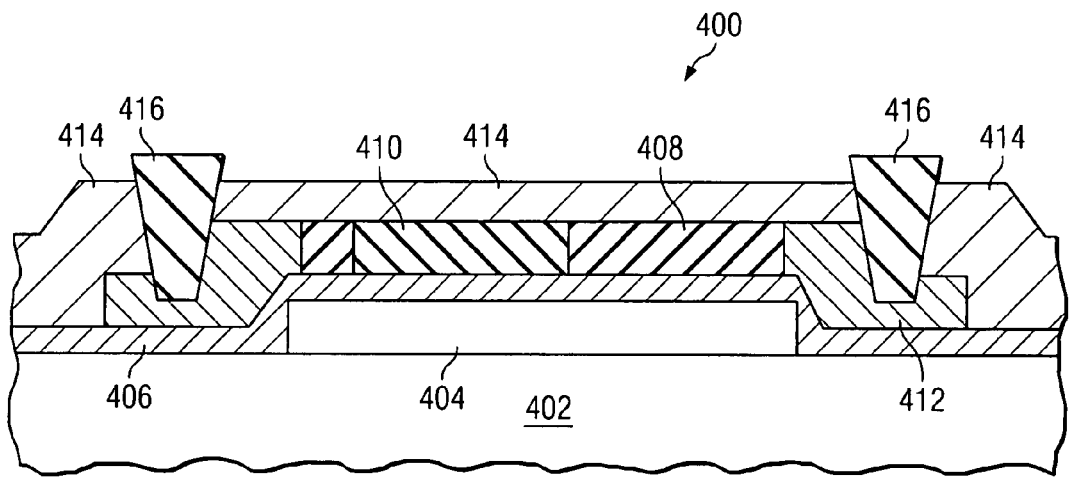

FIG. 4 illustrates a thin film power MOS transistor 400. The transistor 400 shown in FIG. 4 is similar to the transistor 300 shown in FIG. 3. While the transistor 300 shown in FIG. 3 represents a "top-gate" thin film transistor (where the gate 312 is formed above the doped regions 304-308), the transistor 400 shown in FIG. 4 represents a "bottom-gate" thin film transistor. In this example, much of the fabrication process described above with respect to FIG. 3 occurs in a reverse order. In particular, a gate 404 is formed directly on a substrate 402, and a dielectric layer 406 is formed over the gate 404 and the substrate 402. Two N− regions 408, a P− region 410 serving as a p-body, and two N+ regions 412 are formed over the dielectric layer 406, and a passivation layer 414 is formed over the dielectric layer 406 and the doped regions 408-412. Contacts 416 are formed through the passivation layer 414 to contact the N+ regions 412.

In some embodiments, separate N− regions 408 are fabricated. In other embodiments, a single N− region could be fabricated, and a p-body formed by the P− region 410 may be embedded into the single N− region to form the two N− regions 408 shown in FIG. 4. Similarly, in some embodiments, separate N+ regions 412 are fabricated. In other embodiments, a single N+ region could be fabricated, and the N− regions 408 (either as one or multiple regions) and the P− region 410 may be formed in the single N+ region to form the two N+ regions 412 shown in FIG. 4. In addition, the dopings of the regions 408-412 could be reversed, where the regions 408 are doped with P− dopant(s), the region 410 is doped with N− dopant(s) forming an n-body, and the regions 412 are doped with P+ dopant(s).

In particular embodiments, the transistors 300, 400 shown in FIGS. 3 and 4 are fabricated using a mild temperature process and are suitable for use in medium voltage applications. However, the transistors 300, 400 could be fabricated using other processes and/or used in other applications. The mild temperature process could represent, for example, a process where the transistors 300, 400 are fabricated at a maximum temperature between 200° C. and 650° C. The medium voltage application could represent, for example, an application where the transistors 300, 400 are exposed to a maximum voltage of approximately forty volts.

Figure 5:
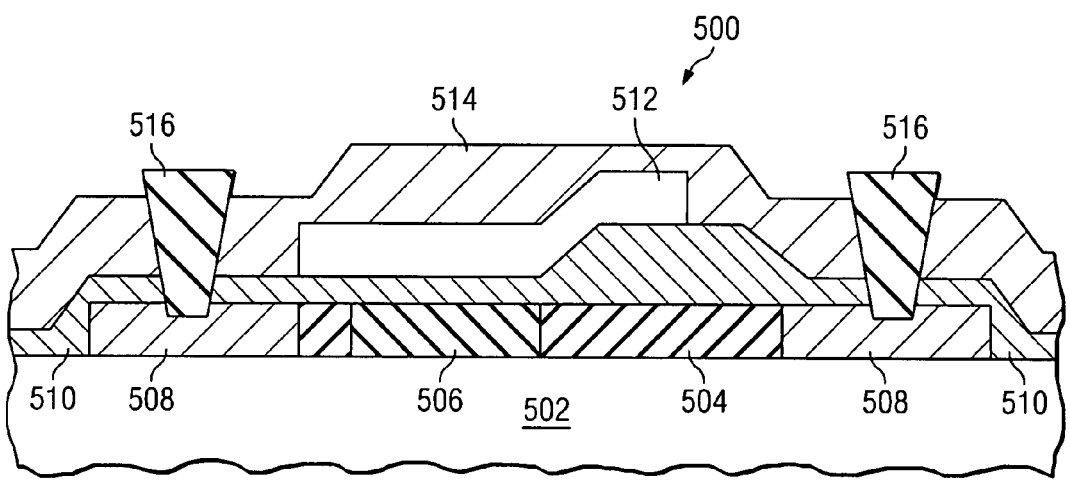

FIG. 5 illustrates a thin film power MOS transistor 500. The transistor 500 includes a rigid or flexible substrate 502. Two N− regions 504, a P− region 506 serving as a p-body, and two N+ regions 508 are formed over the substrate 502. In some embodiments, separate N− regions 504 are fabricated. In other embodiments, a single N− region could be fabricated, and a p-body formed by the P− region 506 may be embedded into the single N-region to form the two N− regions 504 shown in FIG. 5. Similarly, in some embodiments, separate N+ regions 508 are fabricated. In other embodiments, a single N+ region could be fabricated, and the N− regions 504 (either as one or multiple regions) and the P− region 506 may be formed in the single N+region to form the two N+ regions 508 shown in FIG. 5. In addition, the dopings of the regions 504-508 could be reversed, where the regions 504 are doped with P− dopant(s), the region 506 is doped with N− dopant(s) forming an n-body, and the regions 508 are doped with P+ dopant(s).

A dielectric layer 510 is formed over the substrate 502, N− regions 504, P− region 506, and N+ regions 508. As shown in FIG. 5, the dielectric layer 510 has a smaller thickness over the smaller N− region 504 and the P− region 506, and the dielectric layer 510 has a larger thickness over the larger N− region 504. A gate 512 is formed over the dielectric layer 510 and above the N−regions 504 and P− region 506. The gate 512 is formed closer to the P− region 506 and the smaller N− region 504 and farther away from the larger N− region 504. A passivation layer 514 is formed over the dielectric layer 510 and the gate 512. Contacts 516 are formed through the passivation layer 514 and the dielectric layer 510 to contact the N+ regions 508.

The following represents one specific example of how the transistor 500 can be fabricated. An N− doped polysilicon is deposited on the substrate 502, such as by using in-situ PECVD. The N− doped polysilicon is patterned, and a P− type implant is performed. This forms the P− region 506 separating the two N−regions 504. The dielectric layer 510 is deposited on the substrate 502 and the doped regions 504-506, such as by using PECVD. The dielectric layer 510 is then etched to form a field plate, which represents the thicker portion of the dielectric layer 510 over the larger N− region 504. Rapid thermal annealing is performed to form the N+ regions 508. One or more conductive materials are deposited on the dielectric layer 510 and then patterned and etched to form the gate 512. The passivation layer 514 is deposited over the dielectric layer 510 and the gate 512, the passivation layer 514 is patterned and etched, and one or more conductive materials are deposited and etched to form the contacts 516.

In particular embodiments, the transistor 500 shown in FIG. 5 is fabricated using a mild temperature process and is suitable for use in high voltage applications. The mild temperature process could represent, for example, a process where the transistor 200 is fabricated at a maximum temperature between 200° C. and 650° C. The high voltage application could represent, for example, an application where the transistor 200 is exposed to a maximum voltage of greater than forty volts. The transistor 500 could be fabricated using any other process and/or used in any other application.

Although FIGS. 2 through 5 illustrate examples of thin film power MOS transistors, various changes may be made to FIGS. 2 through 5. For example, each layer of material in FIGS. 2 through 5 could be formed from one or multiple layers of one or multiple materials. Also, each of the contacts and gates could represent one or multiple layers of one or multiple materials.

Figure 6:
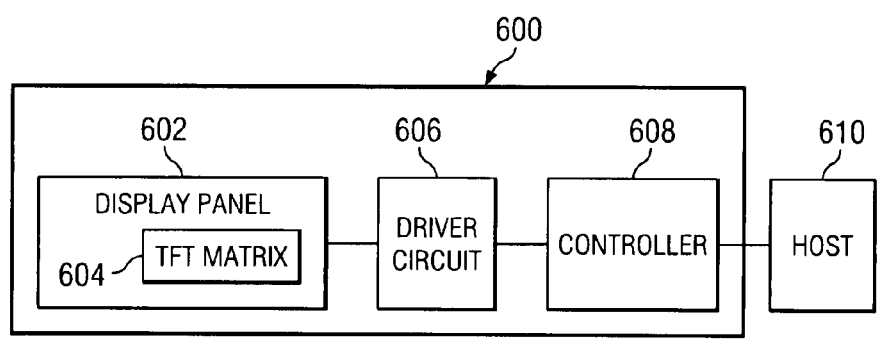
FIG. 6 illustrates an example apparatus including thin film power MOS transistors according to one embodiment of this disclosure.

FIG. 6 illustrates an example apparatus 600 including thin film power MOS transistors according to one embodiment of this disclosure. The embodiment of the apparatus 600 shown in FIG. 6 is for illustration only. Other embodiments of the apparatus 600 may be used without departing from the scope of this disclosure.

In this example, the apparatus 600 represents a liquid crystal display device. As shown in FIG. 6, the apparatus 600 includes a liquid crystal display panel 602. The liquid crystal display panel 602 is capable of presenting graphical images to users of the apparatus 600. The graphical images could include text, static images, and video images. Among other things, the liquid crystal display panel 602 includes a thin film transistor matrix 604. The matrix 604 represents a collection of thin film transistors, such as thin film transistors arranged into rows and columns. The thin film transistors in the matrix 604 could represent one, some, or all of the transistors shown in FIGS. 2 through 5.

In this example, the apparatus 600 also includes a driver circuit 606 and a controller 608. The driver circuit 606 is capable of controlling the transistors in the matrix 604 to control the graphical images displayed on the display panel 602. For example, the driver circuit 606 could be coupled to rows and columns of transistors in the matrix 604 via scanning lines and data lines. The driver circuit 606 may control the thin film transistors by placing the proper signals on the appropriate scanning lines and data lines. The driver circuit 606 includes any suitable structure or structures for controlling transistors in a display panel.

The controller 608 controls the apparatus 600 by controlling the operation of the driver circuit 606. For example, the controller 608 may receive graphics data defining the graphical images to be displayed on the display panel 602. The controller 608 may then cause the driver circuit 606 to output appropriate signals to the proper transistors in the matrix 604 to produce those graphical images. The controller 608 includes any suitable hardware, software, firmware, or combination thereof for controlling the operation of the apparatus 600.

In this example embodiment, the apparatus 600 is coupled to a host 610. The host 610 provides the graphics data to the controller for presentation on the display panel 602. The host 610 represents any suitable source of graphics data, such as a desktop computer, laptop computer, or other computing device or other device capable of generating or providing graphics data. In other embodiments, the source of graphics data could be included in the apparatus 600, such as when the apparatus 600 represents a mobile telephone or other mobile device that includes a processor or other source of graphics data.

Although FIG. 6 illustrates one example of an apparatus 600 including thin film power MOS transistors, various changes may be made to FIG. 6. For example, FIG. 6 illustrates one example of how the thin film transistors shown in FIGS. 2 through 5 could be used. The thin film transistors shown in FIGS. 2 through 5 could be used in any other suitable apparatus or system.

It may be advantageous to set forth definitions of certain words and phrases used in this patent document. The term "couple" and its derivatives refer to any direct or indirect communication between two or more elements, whether or not those elements are in physical contact with one another. The terms "include" and "comprise," as well as derivatives thereof, mean inclusion without limitation. The term "or" is inclusive, meaning and/or. The phrases "associated with" and "associated therewith,"as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like. The term "controller" means any device, system, or part thereof that controls at least one operation. A controller may be implemented in hardware, firmware, or software, or a combination of at least two of the same. It should be noted that the functionality associated with any particular controller may be centralized or distributed, whether locally or remotely.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. A transistor, comprising:
a plurality of first impurity doped regions on and in contact with a substrate;
a second impurity doped region forming a body, at least a portion of the body disposed between the plurality of first impurity doped regions;
a gate over the substrate, at least a portion of one of the plurality of first impurity doped regions, and at least a portion of the second impurity doped region;
a dielectric layer, at least a portion of the dielectric layer disposed between (i) the gate and (ii) the first and second impurity doped regions; and
a plurality of contacts contacting the plurality of first impurity doped regions, the plurality of first impurity doped regions forming a source and a drain of the transistor.

2. The transistor of claim 1, wherein:
the first impurity doped regions comprise n-type regions; and the second impurity doped region comprises a p-type region.

3. The transistor of claim 2, wherein:
the n-type regions comprise N− regions; and
the p-type region comprises a P− region forming a p-body.

4. The transistor of claim 2, wherein:
the n-type regions comprise first and second N+ regions; and
the p-type region comprises a P− region forming a p-body.

5. The transistor of claim 4, further comprising:
a first N− region, at least a portion of the first N− region disposed between the first N+ region and the P− region; and
a second N− region, at least a portion of the second N− region disposed between the second N+ region and the P− region.

6. The transistor of claim 5, wherein the first and second N− regions and the P− region are located at least partially between the gate and the substrate.

7. The transistor of claim 6, wherein the dielectric layer has:
a first thickness between (i) the first N− region and the P− region and (ii) the gate; and
a second thickness between the second N− region and the gate.

8. The transistor of claim 1, wherein:
the first impurity doped regions comprise p-type regions; and
the second impurity doped region comprises an n-type region.

9. The transistor of claim 1, further comprising a passivation layer, the plurality of contacts formed through the passivation layer.

10. The transistor of claim 1, wherein the substrate comprises a flexible substrate selected from the group consisting of cloth, plastic, and metal foil.

11. The transistor of claim 1, wherein the plurality of first impurity doped regions are formed by fabricating a single first impurity doped region and embedding the second impurity doped region in the single first impurity doped region.

12. The transistor of claim 1, wherein the transistor is capable of receiving a voltage in excess of forty volts without damage.

13. A transistor, comprising:
a first and second N+ regions over a substrate, a P− region forming a p-body, at least a portion of the p-body disposed between the first and second N+ regions;
a gate over the substrate;
a dielectric layer, at least a portion of the dielectric layer disposed between (i) the gate and (ii) the first and second N+ regions and the P− region; and
a plurality of contacts contacting the first and second N+ regions, the first and second N+ regions forming a source and a drain of the transistor, wherein the gate is located at least partially between (i) the substrate and (ii) a structure including a first N− region, a second N− region, and the P− region, wherein at least a portion of the first N− region is disposed between the first N+ region and the P− region, and at least a portion of the second N− region is disposed between the second N+ region and the P− region.

14. An apparatus, comprising:
a display panel capable of displaying graphical images, the display panel comprising a matrix of thin film transistors; and a driver circuit capable of controlling the thin film transistors to control the graphical images displayed on the display panel;
wherein each of at least one of the thin film transistors comprises:
   a plurality of first impurity doped regions on and in contact with a substrate;
   a second impurity doped region forming a body, at least a portion of the body disposed between the plurality of first impurity doped regions;
   a gate over the substrate;
   a dielectric layer, at least a portion of the dielectric layer disposed between (i) the gate and (ii) the first and second impurity doped regions; and
   a plurality of contacts contacting the plurality of first impurity doped regions, the plurality of first impurity doped regions forming a source and a drain of the thin film transistor.

15. The apparatus of claim 14, wherein:
the first impurity doped regions comprise n-type regions; and
the second impurity doped region comprises a p-type region.

16. The apparatus of claim 15, wherein:
the n-type regions comprise N− regions; and
the p-type region comprises a P− region forming a p-body.

17. The apparatus of claim 15, wherein:
the n-type regions comprise first and second N+ regions;
the p-type region comprises a P− region forming a p-body; and
each of at least one of the thin film transistors further comprises:
   a first N− region, at least a portion of the first N− region disposed between the first N+ region and the P− region; and
   a second N− region, at least a portion of the second N− region disposed between the second N+ region and the P− region.

18. The apparatus of claim 17, wherein the first and second N− regions and the P− region are located at least partially between the gate and the substrate.

19. The apparatus of claim 18, wherein the dielectric layer has:
   a first thickness between (i) the first N− region and the P− region and (ii) the gate; and
   a second thickness between the second N− region and the gate.

20. The apparatus of claim 14, wherein the substrate comprises a flexible substrate selected from the group consisting of cloth, plastic, and metal foil.

* * * * *